United States Patent
Charlier et al.

(10) Patent No.: US 8,134,358 B2
(45) Date of Patent: Mar. 13, 2012

(54) METHOD OF AUTO CALIBRATING A MAGNETIC FIELD SENSOR FOR DRIFT AND STRUCTURE THEREFOR

(75) Inventors: Olivier Charlier, Brussels (BE); Francois Laulanet, Brussels (BE); Mustafa Badaroglu, Heverlee (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 464 days.

(21) Appl. No.: 11/873,331

(22) Filed: Oct. 16, 2007

(65) Prior Publication Data

US 2008/0238410 A1 Oct. 2, 2008

(30) Foreign Application Priority Data

Oct. 16, 2006 (GB) .................................. 0620307.9

(51) Int. Cl.
    *G01R 35/00* (2006.01)
(52) U.S. Cl. ....................................... 324/202; 324/251
(58) Field of Classification Search .................. 324/202, 324/207.12, 251
    See application file for complete search history.

(56) References Cited

U.S. PATENT DOCUMENTS

| | | | | |
|---|---|---|---|---|
| 5,406,202 A * | 4/1995 | Mehrgardt et al. | ........... | 324/251 |
| 5,604,433 A * | 2/1997 | Theus et al. | ........... | 324/251 |
| 6,777,932 B2 * | 8/2004 | Hara et al. | ........... | 324/251 |
| 6,778,939 B2 * | 8/2004 | Sanpei et al. | ........... | 702/151 |
| 2003/0225539 A1 * | 12/2003 | Motz et al. | ........... | 702/107 |

FOREIGN PATENT DOCUMENTS

WO     WO 2006056829 A1 *    6/2006

OTHER PUBLICATIONS

Alberto Bilotti, "Monolithic Magnetic Hall Sensor Using Dynamic Quadrature Offset Cancellation", Life Senior Member, IEEE, Gerardo Monreal, and Ravi Vig, IEEE Journal of Solid-State Circuits, vol. 32, No. 6, Jun. 1997, pp. 829-836.
Michael Demierre et al., "Reference Magnetic Actuator for Self-Calibration of a Very Small Hall Sensor Array", Sensors and Actuatores A 97-98 (2002) pp. 39-46.
Janez Trontelj et al., "CMOS Integrated Magnetic Field Source Used as a Reference in Magnetic Field Sensors on Common Substrate", 1994 IEEE, pp. 461-463.
Marc Pastre, et al., "A Hall Sensor Analog Front End for Current Measurement With Continuous Gain Calibration", ISSCC 2005/Session 13/Sensors/13.3, 2005 IEEE International Solid-State Circuits Conference, p. 242-243, 596.

* cited by examiner

*Primary Examiner* — Patrick Assouad
*Assistant Examiner* — David M. Schindler
(74) *Attorney, Agent, or Firm* — Robert F. Hightower

(57) ABSTRACT

The present invention provides a method to compensate for the sensitivity drift of a magnetic field sensor for sensing a magnetic field. The magnetic field sensor comprises at least four electrodes. The method comprises a first step where a first set of two electrodes is used to bias the sensor and a second set of two electrodes is used to sense an output signal of the magnetic field sensor, and a second step where the second set of two electrodes is used to bias the sensor and the first set of two electrodes is used to sense an output signal of the magnetic field sensor. The method is characterized in that at least one of the first or the second step is subdivided in at least a first sub-step and a second sub-step. A reference magnetic field has first magnetic field parameters, e.g. a first amplitude and/or direction, in the first sub-step and second magnetic field parameters, a second amplitude and/or direction, in the second sub-step. An output signal is sensed in the first and in the second step, and within the first or the second step an output signal is sensed in the first and the second sub-step.

9 Claims, 12 Drawing Sheets

METHOD OF AUTO CALIBRATING A MAGNETIC FIELD SENSOR FOR DRIFT AND STRUCTURE THEREFOR

CROSS-REFERENCE TO RELATED APPLICATIONS

This patent application claims the benefit of British Patent Application Serial No. 0620307.9, filed Oct. 16, 2006, which patent application is incorporated herein by reference in its entirety.

DESCRIPTION

1. Field of the Invention

The present invention proposes hardware and associated methods to eliminate the offset and the variation of sensitivity affecting magnetic sensors, e.g. integrated Hall sensors. The invention is also of application to other magnetic sensors for which an offset value can be isolated from an output value by using two phases that differ by the direction or the amplitude of a bias signal.

2. Background of the Invention

A Hall sensor for sensing magnetic fields is advantageously integrated in a semiconductor substrate. Such a sensor is typically a planar region of a semiconductor substrate, typically a square region of said substrate, also known as Hall plate, that is implanted with dopant impurities and contacted at least at four points of the square, typically the corners of the square (see FIG. 1). Two diagonally opposed electrodes are used to bias the sensor i.e. force a current $I_{Bias}$ through the doped planar region. When a magnetic field $B_{Ext}$ is applied perpendicularly to the doped planar region, a difference of potential $V_H$ appears across the plate and can be measured between the two remaining electrodes (the sense electrodes):

$$V_H = SB_{Ext} + Vop$$

where $B_{Ext}$ is the component of the magnetic field that is perpendicular to the plate, S is the sensitivity of the plate and Vop is an offset, i.e. a non zero voltage that can be measured between the two sense electrodes when $B_{Ext}=0$. The sensitivity S of the Hall plate is proportional to the bias current $I_{Bias}$. The sensitivity S of the Hall plate is usually a function of the temperature, the magnitude of $B_{Ext}$, thermal shocks, aging of the semiconductor material from which the substrate is made, etc.

In "Monolithic Magnetic Hall Sensor Using Dynamic Quadrature Offset Cancellation" Alberto Bilotti et al. describe the simplest dynamic offset cancellation technique. It uses a single square plate with four contacts where the quadrature states are generated by periodically connecting the supply voltage and the signal conditioner input to different pairs of contacts, as shown in FIG. 2. Each state, which will be called from now on a first and a second state or a 0 degree and a 90 degree state, is defined by the complementary clock signals ck1 and $\overline{ck1}$, respectively. Assuming $B_{Ext}=0$ and an ideal Wheatstone bridge model for the Hall plate, the voltages appearing at the output contacts are the plate offsets $V_{op}(0\ deg)$ and $V_{op}(90\ deg)$ which are equal in magnitude but have opposite polarities (see bottom graph of FIG. 2). This can be verified in very simple way as follows. Assume that an imbalance, for example due to a stress pattern, occurs such that the region between the left hand side and the top contacts a and b shows a resistivity smaller than the rest of the plate and that this situation does not change when changing states. Then, the offsets developed at each state have the same magnitude but opposite polarities, as the same imbalance occurs in adjacent branches of the equivalent bridge network (the Hi terminal will be more positive than the Lo terminal in the 0 degree state but more negative in the 90 degree state). For $B_{Ext}\neq 0$, as the supply and output connections rotate in the same direction, the contribution of $B_{Ext}$ to $V_H$ keeps its polarity unchanged, making it invariant. This characteristic of the contribution of $B_{Ext}$ to $V_H$ derives from the antireciprocal property of a symmetrical Hall plate. There appears, therefore, a simple way to discriminate the offset from the useful signal and further cancelling the offset by appropriate signal conditioning. Although in FIG. 2, it can be seen that the measured signal $V_H$ is quasi-constant and the offset signal Vop is an alternating square wave, waveforms can be interchanged if desired by interchanging diagonally opposed output contacts a and c during the second or 90 degree phase. As an ideally perfect cancellation is never possible, there is in practice a residual plate offset $V_{opr}$ defined as $V_{opr}=|V_{op}(0\ deg)|-|V_{op}(90\ deg)|$ where absolute values have been preferred for emphasizing the polarity reversals occurring during further signal processing. Depending on the fabrication process, Hall plate geometry and crystallographic orientation, and residual wafer and package stresses, the residual plate offset may range between 50-500 µV for a 5-V supply. For the sake of simplicity and unless specified otherwise, it is assumed that $|V_{op}(0\ deg)|=|V_{op}(90\ deg)|=Vop$. The Hall voltage measured across the sense electrodes in the 0 degree state is:

$$V_{H1}=SB_{Ext}+V_{op} \quad (Eq.1)$$

and in the 90 degree state:

$$V_{H2}=SB_{Ext}-V_{op} \quad (Eq.2)$$

By summing Eq. 1 and Eq. 2, the following is obtained:

$$V_{H1}+V_{H2}=2SB_{Ext}$$

which is independent of the offset voltage.

While the dynamic offset cancellation technique explained here above solves the problem of the offset, it does not solve the problem of variations of sensitivity. The sensitivity S of any integrated Hall sensor will vary in function of the temperature, in function of time (aging of the semi-conductor substrate in which the Hall sensor is integrated, aging of the packaging protecting the semiconductor substrate), in function of the amplitude of the magnetic field (which corresponds to a non linearity of the sensor). The temperature dependency for instance can be compensated for by different compensation circuits based on measurements of the sensitivity at different temperatures. Some compensation circuits are dimensioned once and for all. If the temperature dependency of the sensitivity varies for one reason or another, those compensation circuits will not be able to compensate adequately for the temperature variations.

To compensate for the deficiencies of the kind of circuits briefly covered here above, Demierre et al. propose in "Reference Magnetic Actuator for Self-Calibration Of a Very Small Hall Sensor Array", Sensors and Actuators A 97-98 (2002), pages 39-46, to use a known, well determined reference magnetic field $B_{Cal}$ to calibrate the Hall sensor. To differentiate the reference magnetic field form the external magnetic field that one wants to measure, Demierre et al. uses an array of 4 Hall sensors, each sensor being associated with a coil. Each coil generates a known magnetic field. Hence, separation of the external magnetic field and the reference magnetic field generated by the coils requires several coils and several Hall sensors. This is not always desired if the power available for operation of the sensor is limited and/or if the area of semiconductor substrate available to integrate the Hall sensors is limited.

In "CMOS Integrated Magnetic Field Source Used as a Reference in Magnetic Field Sensors on Common Substrate" published in the proceedings of the IMTC 94 (Instrumentation and Measurement Technology Conference 1994. IMTC/ 94 Conference Proceedings, 10th Anniversary, Advanced Technologies in I & M., 1994, IEEE Publication Date of May 10-12, 1994, pages 461-463. Vol. 2), Trontelj et al. also rely on a reference magnetic field $B_{Cal}$ generated by a coil surrounding the Hall sensor to calibrate the Hall sensor and to compensate sensitivity drifts. To separate the external magnetic field $B_{Ext}$ from the reference magnetic field $B_{Cal}$, the reference magnetic field is modulated at a pre-determined frequency higher than the clock signal that determines the 0 degree and 90 degree phase. The contributions to the Hall voltage of both fields are then separated with a very selective filter. Such a filter is not always easy to realize and furthermore consumes additional power and silicon area. There remains a need for improvement.

SUMMARY OF THE INVENTION

It is an object of embodiments of the present invention to provide good magnetic sensor devices or good methods for providing magnetic sensing.

The above objective is accomplished by a device and a method according to the present invention.

In an aspect, the present invention proposes to isolate the contribution of a reference magnetic field $B_{Cal}$ to the output signal of a magnetic sensor from the contribution of an external magnetic field $B_{Ext}$ to the same output signal without having to use several sensors and/or specific filters as in the prior art. Having isolated the contribution from the reference magnetic field, it is easy to evaluate the sensitivity drift of the magnetic sensor generating the output signal and to compensate for said sensitivity drift.

A sensor according to embodiments of the present invention comprises at least four electrodes, two of which are used to bias the sensor by circulating a bias current through the sensor and two of which are used to sense an output signal, e.g. voltage, $V_H$. The sensor is surrounded by a reference magnetic field generator, e.g. a current carrying coil, said reference magnetic field generator, e.g. coil, being used to generate a reference magnetic field $B_{Cal}$.

In a first aspect, the present invention provides a method to compensate the sensitivity drift of a magnetic field sensor for sensing a magnetic field. The magnetic field sensor comprises at least four electrodes. The method comprises a first step where a first set of two electrodes is used to bias the sensor and a second set of two electrodes is used to sense an output signal, e.g. a voltage signal, of the magnetic field sensor, and a second step where the second set of two electrodes is used to bias the sensor and the first set of two electrodes is used to sense an output signal of the magnetic field sensor. The method is characterized in that at least one of the first or the second step is subdivided in at least a first sub-step and a second sub-step. A reference magnetic field has first magnetic field parameters, e.g. a first amplitude and/or direction, in the first sub-step and second magnetic field parameters, a second amplitude and/or direction, in the second sub-step. At least one of the first magnetic field parameters is different from the second magnetic field parameters. An output signal is sensed in the first and in the second step, and within the first or the second step an output signal is sensed in the first and the second sub-step. This means that within the first or the second step, the output signal is sensed both when the calibration magnetic field $B_{Cal}$ assumes the first magnetic field parameters, e.g. a first amplitude, and when the calibration magnetic field assumes the second magnetic field parameters, e.g. a second amplitude.

In embodiments of the present invention, the reference magnetic field generated during the first sub-step may have the same amplitude as the reference magnetic field generated during the second sub-step, both reference magnetic fields having an opposite direction.

In alternative embodiments of the present invention, the reference magnetic field generated during the first sub-step may have the same direction as the reference magnetic field generated during the second sub-step, both reference magnetic fields having a different amplitude. In particular embodiments, one of the amplitudes may be zero amplitude (i.e. $B_{Cal}=0$).

In yet other embodiments of the present invention, the reference magnetic field has a monotonically changing amplitude during the first or the second sub-step.

A method according to embodiments of the present invention may furthermore comprise performing a correlated double sampling on the sensed output signal of the magnetic field sensor.

In a specific embodiment, the present invention provides a method to isolate the contribution of a reference magnetic field to the output signal of a magnetic field sensor. The method comprises:

a first step where a first set of two electrodes is used to bias the sensor and a second set of two electrodes is used to sense a voltage; and a second step where the second set of two electrodes is used to bias the sensor and the first set of two electrodes is used to sense a voltage;

the method being characterized in that at least one of the first or the second step is subdivided in at least two sub-steps (a first sub-step and a second sub-step), the reference magnetic field generated by the magnetic field generator, e.g. coil, assuming a first amplitude and/or direction in the first sub-step and a second amplitude and/or direction in the second sub-step.

The above-described method embodiments of the present invention may be implemented in a processing system. One configuration of a processing system includes at least one programmable processor coupled to a memory subsystem that includes at least one form of memory, e.g., RAM, ROM, and so forth. It is to be noted that the processor or processors may be a general purpose, or a special purpose processor, and may be for inclusion in a device, e.g., a chip that has other components that perform other functions. Thus, one or more aspects of the present invention can be implemented in digital electronic circuitry, or in computer hardware, firmware, software, or in combinations of them. The processing system may include a storage subsystem that has at least one disk drive and/or CD-ROM drive and/or DVD drive. In some implementations, a display system, a keyboard, and a pointing device may be included as part of a user interface subsystem to provide for a user to manually input information, for example to input instructions for performing a calibration step. Ports for inputting and outputting data also may be included. One of such port may for example receive external triggers, such as e.g. temperature signals, for triggering a calibration step. More elements such as network connections, interfaces to various devices, and so forth, may be included as well, but are not described in detail. The various elements of the processing system may be coupled in various ways, including via a bus subsystem, which may be a single bus, but will be understood to those in the art to include a system of at least one bus. The memory of the memory subsystem may at some time hold part or all of a set of instructions that when executed on the processing system implement the steps of the method embodiments described herein. Thus, while a processing system as described above is prior art, a system that includes the instructions to implement aspects of the methods for compensating for the sensitivity drift of a magnetic field sensor device is not prior art.

The present invention also includes a computer program product which provides the functionality of any of the methods according to the present invention when executed on a computing device. Such computer program product can be tangibly embodied in a carrier medium carrying machine-readable code for execution by a programmable processor. The present invention thus relates to a carrier medium carrying a computer program product that, when executed on computing means, provides instructions for executing any of the methods as described above. The term "carrier medium" refers to any medium that participates in providing instructions to a processor for execution. Such a medium may take many forms, including but not limited to, non-volatile media, and transmission media. Non-volatile media includes, for example, optical or magnetic disks, such as a storage device which is part of mass storage. Common forms of computer readable media include, a CD-ROM, a DVD, a flexible disk or floppy disk, a memory key, a tape, a memory chip or cartridge or any other medium from which a computer can read. Various forms of computer readable media may be involved in carrying one or more sequences of one or more instructions to a processor for execution. The computer program product can also be transmitted via a carrier wave in a network, such as a LAN, a WAN or the Internet. Transmission media can take the form of acoustic or light waves, such as those generated during radio wave and infrared data communications. Transmission media include coaxial cables, copper wire and fibre optics, including the wires that comprise a bus within a computer.

In a further aspect, the present invention provides a magnetic field measurement device. The magnetic field measurement device according to embodiments of the present invention comprises:

a magnetic field sensor, e.g. a Hall sensor, for sensing a magnetic field, the magnetic field sensor comprising at least four electrodes;

a biasing element for biasing the magnetic field sensor;

a measurement circuit for measuring an output signal of the magnetic field sensor;

a switch box for connecting a first set of electrodes to the biasing element; and a second set of electrodes to the readout circuitry during a first time period, and for connecting the second set of electrodes to the biasing element and the first set of electrodes to the readout circuitry during a second time period;

a reference magnetic field generator for generating a reference magnetic field; and a reference magnetic field biasing element for changing magnetic field parameters of the reference magnetic field.

The magnetic field measurement device is adapted for changing the reference magnetic field parameters within at least one of the first or the second time period.

In embodiments of the present invention, the measurement circuit is adapted to sense an output signal of the magnetic field sensor at least once during each of the first and the second time period, and during at least one of the first and the second time period before and after changing of the reference magnetic field parameters.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
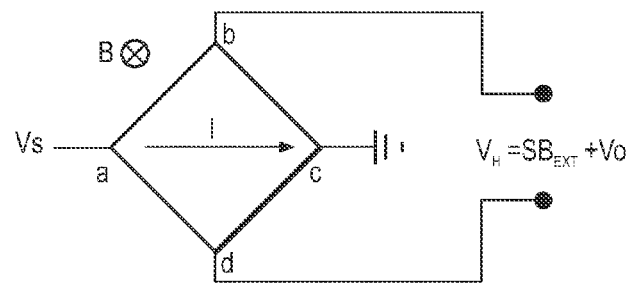
FIG. 1 is a schematic presentation of a standard Hall plate.
Figure 2:
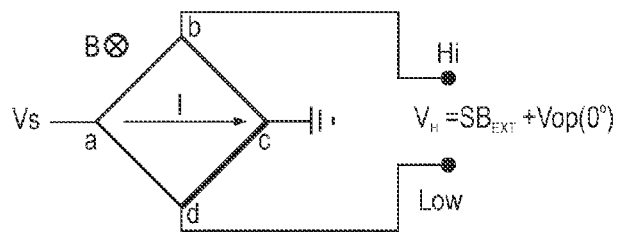
FIG. 2 shows the principle of the dynamic offset cancellation technique from the prior art.
Figure 2:
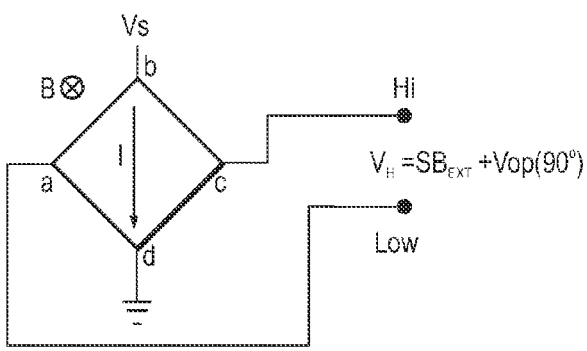
Figure 2:
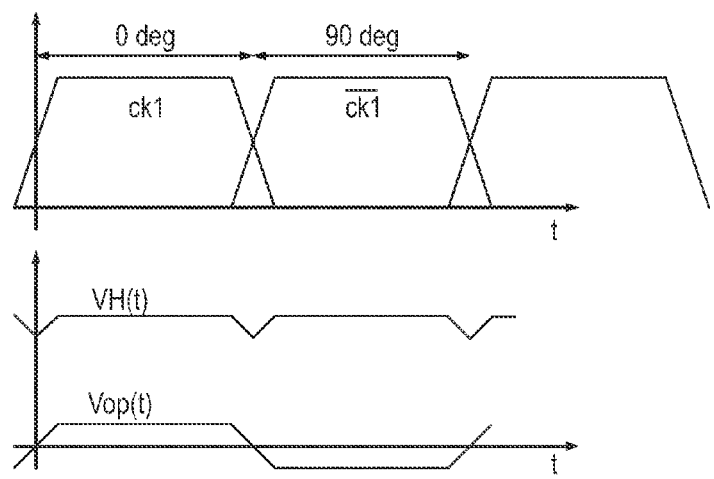

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

In a first embodiment, the present invention builds on the dynamic offset compensation method of the prior art described here above to separate the contribution of the offset, the external magnetic field $B_{Ext}$ and the reference magnetic field $B_{Cal}$ to the output signal of a Hall sensor.

Figure 3:
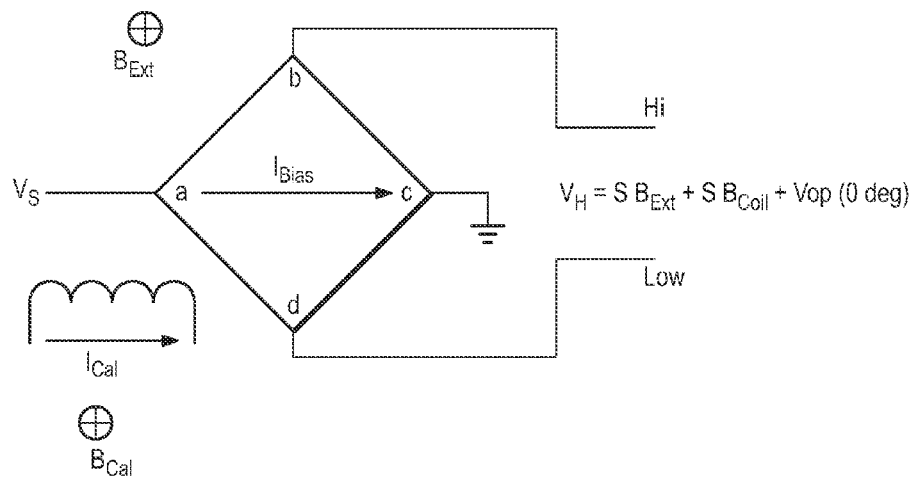
FIG. 3 illustrates phase 1 of a first embodiment of a method according to embodiments of the present invention to isolate the contributions of the external magnetic field, the reference magnetic field and the offset to the output of the signal of the sensor.

In a first phase, e.g. 0° phase, as illustrated in FIG. 3, a bias signal for biasing the Hall sensor is applied between a first set of two diagonally opposed electrodes a, c, e.g. a bias current $I_{Bias}$ is applied between the electrodes a, c. The sensor signal $V_H$ is measured between Hi and Lo terminals connected to a second set of two diagonally opposed electrodes b, d.

The reference magnetic field $B_{Cal}$ is generated by a magnetic field generator, e.g. a reference current $I_{Cal}$ flowing through a coil, in the vicinity of the magnetic sensor device, e.g. Hall sensor, e.g. a coil surrounding the Hall plate.

The reference current $I_{Cal}$ is kept constant in magnitude and direction during the first phase, e.g. the 0 degree state. The Hall voltage $V_H$ across the Hi and Lo terminals is then:

$$V_{H1} = SB_{Ext} + SB_{Cal} + V_{op} \tag{Eq. 3}$$

In accordance with embodiments of the present invention, the second phase or 90 degree phase is subdivided in two sub-phases. During both sub-phases of the second phase, a bias signal for biasing the Hall sensor is applied between the second set of two diagonally opposed electrodes b, d, e.g. a bias current $I_{Bias}$ is applied between the electrodes b, d. The sensor signal $V_H$ is measured between Hi and Lo terminals connected to the first set of two diagonally opposed electrodes a, c.

Figure 4:
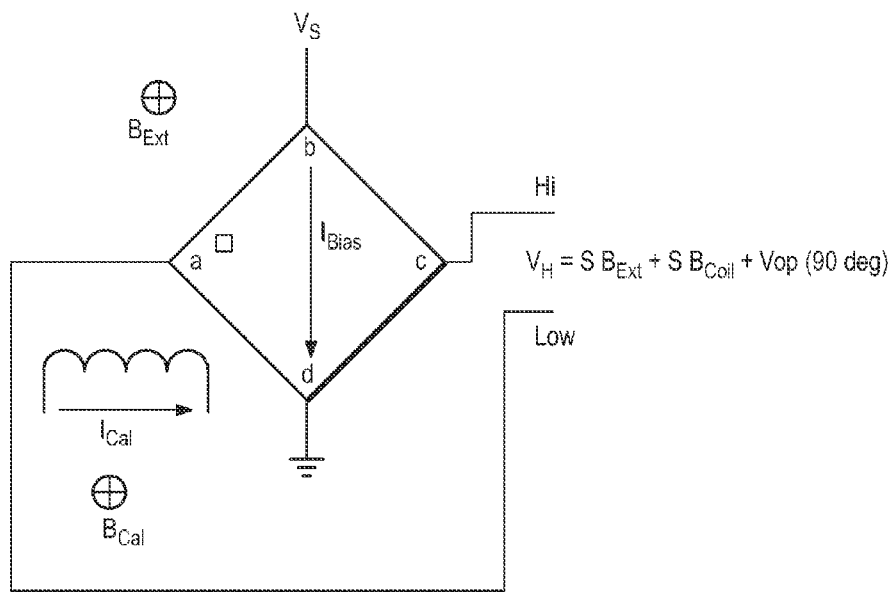
FIG. 4 illustrates phase 2, sub-phase 1 of the first embodiment of a method according to embodiments of the present invention.

In the first of the two 90 degree sub-phases, as illustrated in FIG. 4, the reference current $I_{Cal}$ keeps the magnitude and the direction it had during the first phase, e.g. 0 degree state. The Hall voltage $V_H$ across the Hi and Lo terminals is:

$$V_{H2} = SB_{Ext} + SB_{Cal} - V_{op} \quad \text{(Eq. 4)}$$

Figure 5:
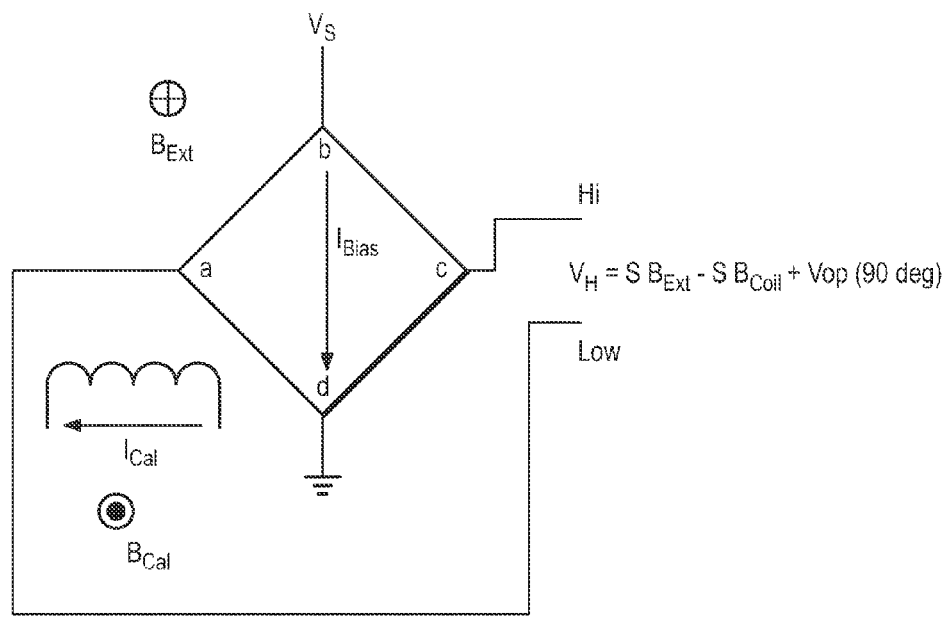
FIG. 5 illustrates phase 2, sub-phase 2 of the first embodiment of a method according to embodiments of the present invention.

In the second of the two 90 degree sub-phases, as illustrated in FIG. 5, the reference current $I_{Cal}$ keeps the magnitude it had during the 0 degree state and the first of the two 90 degree sub-phases, but its direction is changed so that the direction of the reference or calibration field is rotated by 180 degrees. The Hall voltage $V_H$ across the Hi and Lo terminals is:

$$V_{H3} = SB_{Ext} - SB_{Cal} - V_{op} \quad \text{(Eq. 5)}$$

The system composed of the three equations Eq. 3, Eq. 4, Eq. 5 is linear in the three unknowns $x = S B_{Ext}$, $y = S B_{Cal}$ and $z = V_{op}$. Its principal determinant is:

$$\begin{vmatrix} 1 & 1 & 1 \\ 1 & 1 & -1 \\ 1 & -1 & -1 \end{vmatrix}$$

which is equal to −4. Since that determinant is non zero, it guarantees that there exists one and only one solution for the three unknowns $x = S B_{Ext}$, $y = S B_{Cal}$ and $z = V_{op}$ satisfying the three equations Eq. 3, Eq. 4, and Eq. 5 simultaneously.

If the product $y = S B_{Cal}$ varies from one instant to another, the amplitude of the referenced magnetic field $B_{Cal}$ being constant (in view of the magnitude of reference current $I_{Cal}$ being kept constant), it means that the sensitivity S of the Hall sensor has varied. Knowledge of the variations of the sensitivity S through knowledge of variations of $y = S B_{Cal}$ can be used to correct the measurements made for the external magnetic field $B_{Ext}$ through scaling for instance.

Comparison of the actual value for the product $y = S B_{Cal}$ with a reference value $y_0 = S_0 B_{Cal}$ (corresponding to a given temperature $T_0$, a given level of total magnetic field $B_0$ crossing the sensor, a given time instant $t_0$, or a combination of these initial conditions) makes the determination of a correction factor $\alpha = y_0/y$ possible. Having $S_0 = \alpha S$, it is possible to correct the variation of sensitivity S affecting the product $x = S B_{Ext}$ by multiplying it by $\alpha$. This correction ensures that the measurements made for the external magnetic field $B_{Ext}$ will not be affected by sensitivity drift.

Figure 6:
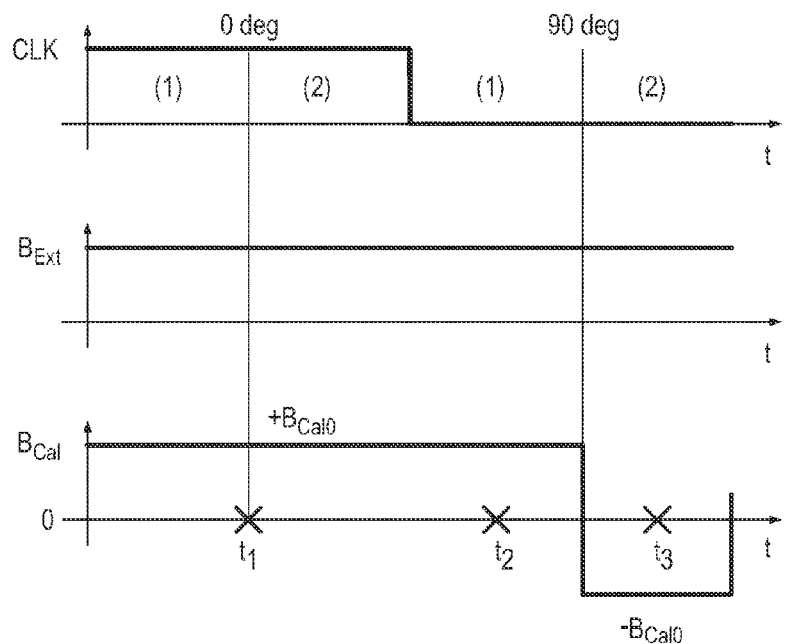
FIG. 6 illustrates a time chart for a method according to the first embodiment of the present invention.

A timing chart for this first embodiment is illustrated in FIG. 6. It shows a clock signal CLK determining whether the system is in the first phase or 0 degree phase, or in the second phase or 90 degree phase. The clock signal CLK, in the embodiment illustrated, may be a digital signal having only two states, e.g. a high state "1" and a low state "0". Depending on the value of the clock signal CLK the first set of diagonally opposed electrodes a, c or the second set of diagonally opposed electrodes b, d of the magnetic sensor device is used for measuring, while the other set of diagonally opposed electrodes is used for biasing the magnetic sensor device. The timing chart of FIG. 6 also shows the external magnetic field $B_{Ext}$, which is the field to be measured, and which is constant over the two phases. FIG. 6 also illustrates the reference magnetic field $B_{Cal}$ which has a first direction and an amplitude $B_{Cal0}$ during the first phase and the first part of the second phase, and which has the same amplitude $B_{Cal0}$ but a different direction during the second part of the second phase. Measurements of the output signal of the magnetic sensor device, e.g. the Hall voltage between the Hi and Lo terminals, is performed at time instants t1, t2 and t3, i.e. once (t1) during the first phase, once (t2) during the first sub-phase of the second phase and once (t3) during the second sub-phase of the second phase.

Figure 7:
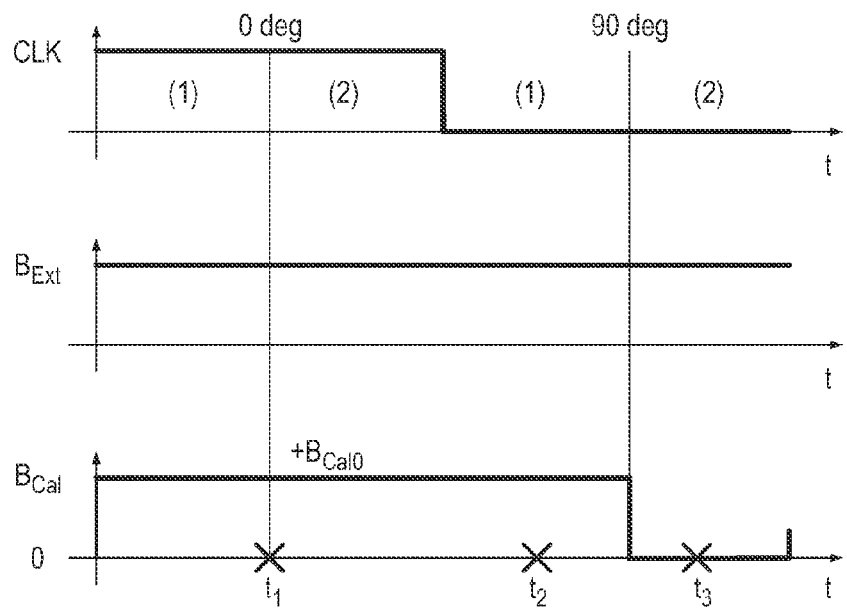
FIG. 7 illustrates a time chart for a method according to a second embodiment of the present invention.

In a second embodiment, as illustrated in the time chart of FIG. 7, the reference or calibration magnetic field $B_{Cal}$ is cancelled (magnitude is zero) during one of the two 90 degree sub-phases, e.g. during the second 90 degree sub-phase, rather than being inversed in direction while keeping the same amplitude. In the first of the two 90 degree sub-phases, in accordance with this embodiment, the reference current $I_{Cal}$ keeps the magnitude and the direction it had during the 0 degree state. The resulting system of equations is:

$$V_{H1} = SB_{Ext} + SB_{Cal} + V_{op} \quad \text{(Eq. 6)}$$

$$V_{H2} = SB_{Ext} + SB_{Cal} - V_{op} \quad \text{(Eq. 7)}$$

$$V_{H3} = SB_{Ext} - V_{op} \quad \text{(Eq. 8)}$$

The principal determinant of that system of equations on the unknowns $x = S B_{Ext}$, $y = S B_{Cal}$ and $z = V_{op}$ is:

$$\begin{vmatrix} 1 & 1 & 1 \\ 1 & 1 & -1 \\ 1 & 0 & -1 \end{vmatrix}$$

which is equal to −2. Since that determinant is non zero, it guarantees that there exists one and only one solution for the three unknowns $x = S B_{Ext}$, $y = S B_{Cal}$ and $z = V_{op}$ satisfying the three equations Eq. 6, Eq. 7, and Eq. 8 simultaneously.

If the product $y = S B_{Cal}$ varies from one instant to another, the amplitude of reference magnetic field $B_{Cal}$ being constant (in view of the magnitude of the reference current $I_{Cal}$ generating the reference magnetic field $B_{Cal}$ being kept constant), it means that the sensitivity S of the magnetic sensor device, e.g. Hall sensor, has varied. Knowledge of the variations of the sensitivity S through knowledge of variations of $y = S B_{Cal}$ can be used to correct the measurements made for the external magnetic field $B_{Ext}$ to be measured, through scaling for instance.

Again, comparison of the actual value for the product $y = S B_{Cal}$ with a reference value $y_0 = S_0 B_{Cal}$ (corresponding to a given temperature $T_0$, a given level of total magnetic field $B_0$ crossing the sensor, a given time instant $t_0$, or a combination of these initial conditions) makes the determination of a correction factor $\alpha = y_0/y$ possible. Having $S_0 = \alpha S$, it is possible to correct the variation of sensitivity S affecting the product $x = S B_{Ext}$ by multiplying it by $\alpha$. This correction ensures that the measurements made for the external magnetic field $B_{Ext}$ will not be affected by sensitivity drift.

Figure 8:
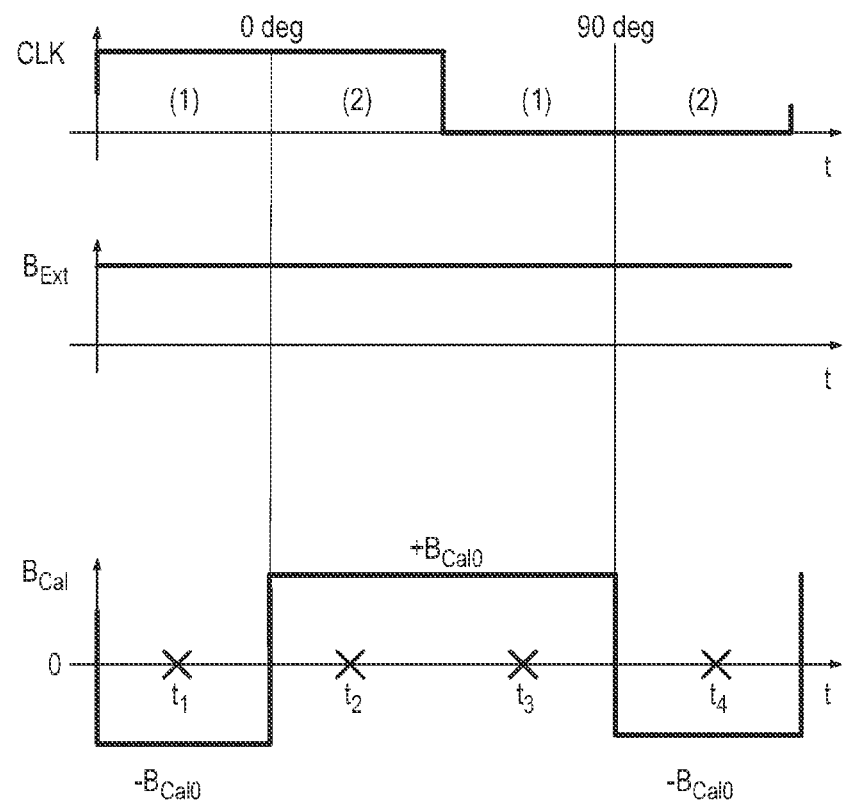
FIG. 8 illustrates a time chart for a method according to a third embodiment of the present invention.

In a third embodiment, the first and second phases, e.g. 0 degree and 90 degree phases, are both divided into two sub-phases where the direction and/or the magnitude of the calibration field is changed (see for instance FIG. 8). The resulting values obtained for the product $S B_{Cal}$ can be e.g. averaged to determine whether or not the sensitivity S has varied.

First the case is considered where the amplitude of the calibration field is kept constant but its direction is varied from one sub-phase to another and this for both the 0 degree and the 90 degree phases (see FIG. 8). Measurements of the output voltages $V_{H1}$, $V_{H2}$, $V_{H3}$, $V_{H4}$ are performed at time instants $t_1$, $t_2$, $t_3$ and $t_4$ in each of the sub-phases, respectively.

In that case, measuring the output voltages $V_{H1}$, $V_{H2}$, $V_{H3}$, $V_{H4}$ of the Hall sensor in each of the sub-phases will yield four linear equations. Contrary to what has been done in the above embodiments, it does not have to be assumed that the offset $V_{op}$ is the same in the first and second phases, e.g. the 0 degree and the 90 degree phases. The following equations are obtained:

$$V_{H1}=SB_{Ext}-SB_{Cal}+V_{op}(0\text{deg}) \quad (\text{Eq. 9})$$

$$V_{H2}=SB_{Ext}+SB_{Cal}+V_{op}(0\text{deg}) \quad (\text{Eq. 10})$$

$$V_{H3}=SB_{Ext}+SB_{Cal}-V_{op}(90\text{degree}) \quad (\text{Eq. 11})$$

$$V_{H4}=SB_{Ext}-SB_{Cal}-V_{op}(90\text{deg}) \quad (\text{Eq. 12})$$

Four linear equations are thus obtained (Eq. 9, Eq. 10, Eq. 11, Eq. 12) in the four unknowns $S\,B_{Ext}$, $S\,B_{Cal}$, $V_{op}$ (0 deg) and $V_{op}$ (90 deg).

The principal determinant of that system of equations in these 4 unknowns is:

$$\begin{vmatrix} 1 & -1 & 1 & 0 \\ 1 & 1 & 1 & 0 \\ 1 & 1 & 0 & -1 \\ 1 & -1 & 0 & -1 \end{vmatrix}$$

which is equal to 0, meaning that unique solutions for (each of) the unknowns $S\,B_{Ext}$, $S\,B_{Cal}$, $V_{op}$ (0 deg) and $V_{op}$ (90 degree) cannot be found by applying the well known resolution algorithm. Instead of solving the equations for all of the unknowns, $S\,B_{Cal}$ can be estimated by averaging the measured output voltages as follows:

$$SB_{Cal}=\tfrac{1}{4}(V_{H2}-V_{H1}+V_{H3}-V_{H4}) \quad (\text{Eq. 13})$$

Once the estimated value for $S\,B_{Cal}$ is known, it is possible to evaluate the variation of the sensitivity S of the Hall sensor and to compensate for it by e.g. scaling as discussed in the above.

Figure 9:
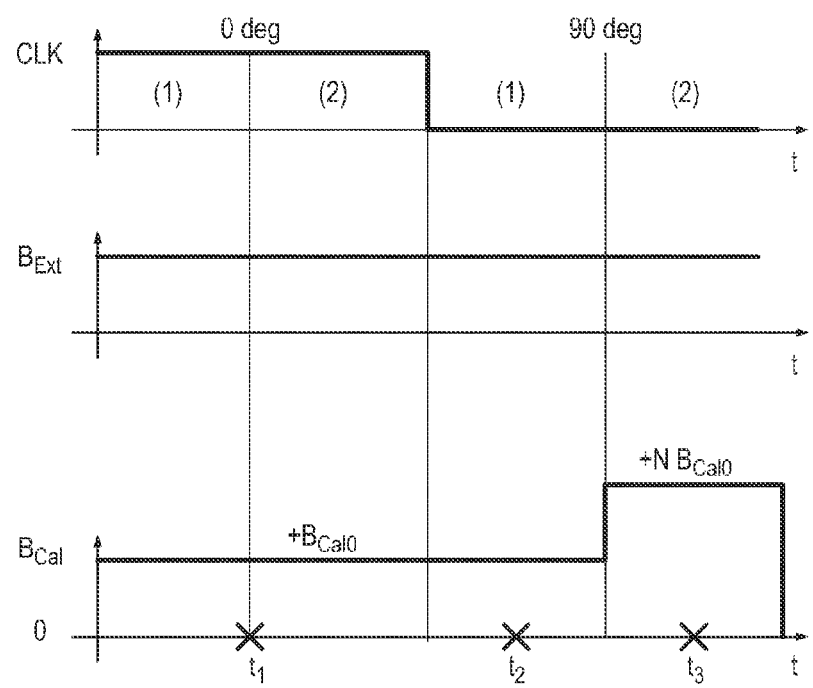
FIG. 9 illustrates a time chart for a method according to a fourth embodiment of the present invention.

In a fourth embodiment, as illustrated in the time chart of FIG. 9, the reference or calibration magnetic field $B_{Cal}$ is increased in amplitude during one of the two 90 degree sub-phases, e.g. during the second 90 degree sub-phase, and not inversed in direction. In the first of the two 90 degree sub-phases, in accordance with this embodiment, the reference current $I_{Cal}$ keeps the magnitude and the direction it had during the 0 degree state. The resulting system of equations is:

$$V_{H1}=SB_{Ext}+SB_{Cal}+V_{op} \quad (\text{Eq. 14})$$

$$V_{H2}=SB_{Ext}+SB_{Cal}-V_{op} \quad (\text{Eq. 15})$$

$$V_{H3}=SB_{Ext}+SNB_{Cal}-V_{op} \quad (\text{Eq. 16})$$

The principal determinant of that system of equations on the unknowns $x=S\,B_{Ext}$, $y=S\,B_{Cal}$ and $z=V_{op}$ is:

$$\begin{vmatrix} 1 & 1 & 1 \\ 1 & 1 & -1 \\ 1 & N & -1 \end{vmatrix}$$

which is equal to $2N-2$. The principal determinant $\text{Det}(N)$ of the system is thus function of N. For $N=2$, the principal determinant is equal to 2. For $N=0.5$, the principal determinant is equal to $-1$ (in which case no division by the principal determinant is strictly required when solving the system of equation for its unknowns). For $N=1.5$ the principal determinant is equal to 1 (in which case solving the system for its unknowns, will require no division and no change of sign).

From these examples, it appears that the choice of N influence the complexity of the digital calculator used to solve the system. A proper choice for N may also simplify the design of an analog calculator: analog division is complex and prone to errors, drift with temperature, and therefore, choosing $N=1.5$ or $N=0.5$ will allow solving the system of equations without division by $\text{Det}(N)$.

Since the above determinant is non zero if N is different from 1 (meaning that the amplitude of the external magnetic field $B_{Cal}$ during the second sub-phase of the second phase differs from the amplitude of the external magnetic field $B_{Cal}$ during the first phase and the first sub-phase of the second phase), the set-up where the external magnetic field is changed at the second sub-phase to a value higher than the value during the other phase and sub-phase, guarantees that there exists one and only one solution for the three unknowns $x=S\,B_{Ext}$, $y=S\,B_{Cal}$ and $z=V_{op}$ satisfying the three equations Eq. 14, Eq. 15, and Eq. 16 simultaneously.

If the product $y=S\,B_{Cal}$ varies between time instant $t_1$ and time instant $t_2$, the amplitude of reference magnetic field $B_{Cal}$ being constant (in view of the magnitude of the reference current $I_{Cal}$ generating the reference magnetic field $B_{Cal}$ being kept constant), it means that the sensitivity S of the magnetic sensor device, e.g. Hall sensor, has varied. Knowledge of the variations of the sensitivity S through knowledge of variations of $y=S\,B_{Cal}$ can be used to correct the measurements made for the external magnetic field $B_{Ext}$ to be measured, through scaling for instance.

Again, comparison of the actual value for the product $y=S\,B_{Cal}$ with a reference value $y_0=S_0\,B_{Cal}$ (corresponding to a given temperature $T_0$, a given level of total magnetic field $B_0$ crossing the sensor, a given time instant $t_0$, or a combination of these initial conditions) makes the determination of a correction factor $\alpha=y_0/y$ possible. Having $S_0=\alpha\,S$, it is possible to correct the variation of sensitivity S affecting the product $x=S\,B_{Ext}$ by multiplying it by $\alpha$. This correction ensures that the measurements made for the external magnetic field $B_{Ext}$ will not be affected by sensitivity drift.

In the above embodiments where only one phase is divided into sub-phases where the reference magnetic field $B_{Cal}$ has different properties, the reference magnetic field keeps its value during the first phase, e.g. 0 degree phase, and it is the second phase, e.g. the 90 degree phase, which is divided in two sub-phases each having different properties for the reference magnetic field. This, however, is not intended to be limiting for the invention. In alternative embodiments, not illustrated in the drawings, the reference magnetic field could have different properties during two sub-phases of the first phase, e.g. 0 degree phase, while keeping constant properties during the complete second phase, e.g. 90 degree phase.

Moreover, in the examples illustrated, the first and second phases have equal time duration, which is not intended to be a limiting feature for the present invention. Also the sub-phases may have, but do not need to have, equal time durations.

Measurements may be performed at about the middle of a time period of a phase or a sub-phase, but also other moments in time may be selected for performing the measurement, e.g. more towards the end of a phase or sub-phase, or more towards the beginning of a phase or sub-phase.

Effects that will affect the sensitivity S are for example, without being exhaustive, temperature, aging, stress applied on a semiconductor substrate within which the Hall sensor is integrated. With a notable exception that will be discussed later, those effects usually have time constants that are far greater than the typical time it takes to make the measurements $V_{H1}$, $V_{H2}$, $V_{H3}$ (and optionally $V_{H4}$). Therefore, generation of the calibration field $B_{Cal}$ and evaluation of the quantity $S \, B_{Cal}$ need not necessarily be carried out every time the external magnetic field $B_{Ext}$ is measured. Calibration may be done on a regular basis at a lower rate than the rate at which the first and second phases, e.g. 0 degree and 90 degree phases, change.

Figure 10:
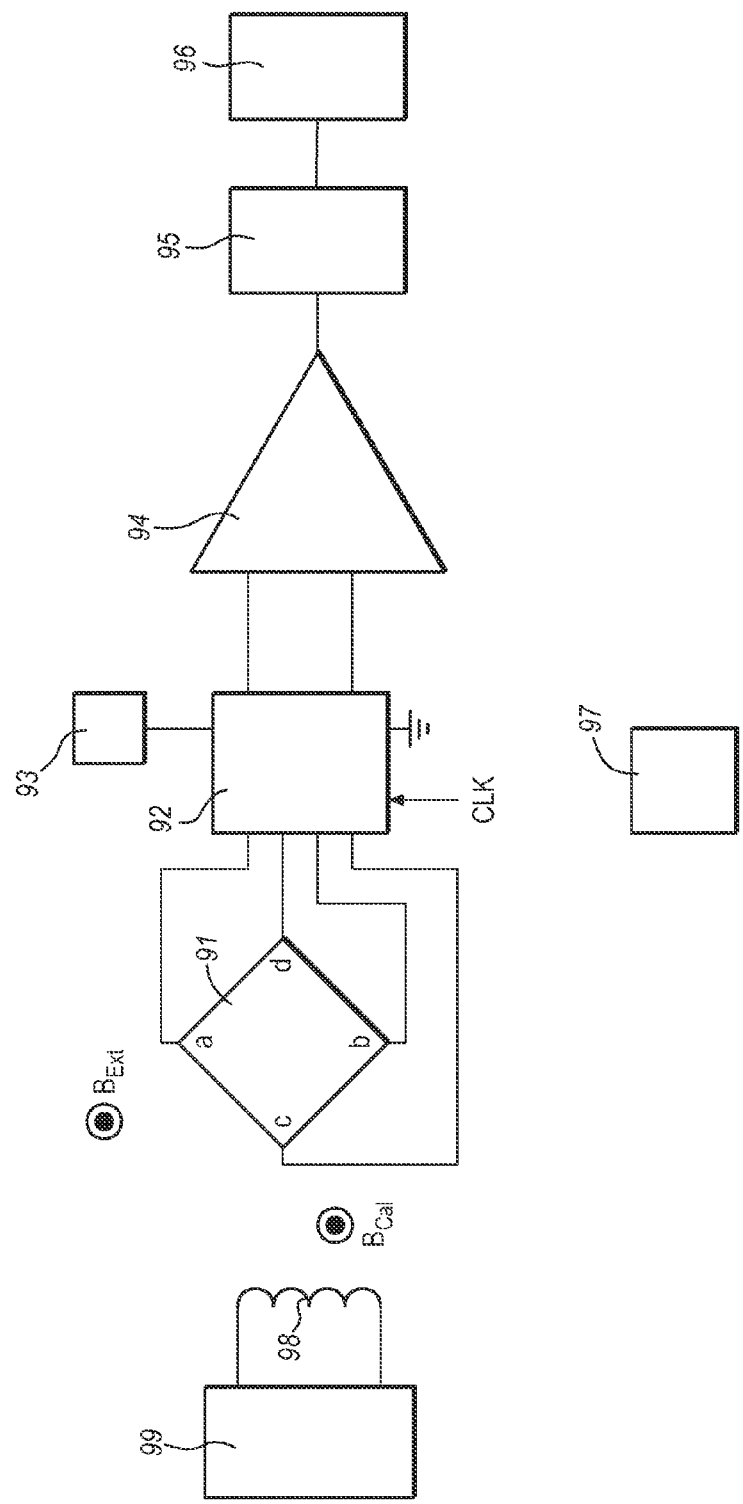
FIG. 10 illustrates an implementation of a device according to an embodiment of the present invention suitable for performing any of the methods of the present invention.

An example of hardware that implements the calibration methods according to embodiments of the present invention is given in FIG. 10.

A magnetic sensor device, e.g. a Hall sensor 91, has its four main electrodes (a, b, c, d) connected to a switch box 92. The configuration of the switches of the switchbox 92 is determined by the digital signal CLK. When the signal CLK is in a first state, e.g. a '1' or high state (H), the switch box 92 will connect the electrodes a and b to a biasing element 93 (either a bias current source or a bias voltage supply) and to a reference voltage e.g. ground as in FIG. 10, and the electrodes c and d to the inputs of an amplification stage 94 with gain G. When the signal CLK is in a second state, e.g. a '0' or low state (L), the switch box 92 will connect the electrodes c and d to the biasing element 93 (either a bias current source or a bias voltage supply) and to a reference voltage e.g. ground as in FIG. 10, and the electrodes a and b to the inputs of the amplification stage 94 with gain G. The gain G is assumed not to vary with temperature. This assumption is verified e.g. in an integrated circuit where the gain G is usually determined by the ratio of two resistances of resistors having the same temperature coefficient and which age substantially identically, or by the ratio of two capacitances of capacitors having the same temperature coefficient and which age substantially identically. This assumption is made for the sake of clarity only and does not limit the scope of this invention, as variation of the gain with a parameter such as e.g. temperature will be compensated analogously to the variation of sensitivity S of the magnetic sensor device (to reach that conclusion one will reason on the quantities $G^*S \, B_{Ext}$, $G^*S \, B_{Cal}$ and $G^*V_{op}$). In both states of the signal CLK, the voltage difference between the inputs of the amplifier 94 is the Hall voltage $V_H$, i.e. the output voltage of the magnetic sensor device. The amplified Hall signal $G^*V_H$ at the output of amplifier 94 may be fed to a calculator unit. The calculator unit may be an analog calculator for performing calculations on the analog values. In alternative embodiments, the calculator may comprise an analog to digital converter (ADC) 95, the output of which is fed to a digital processing unit. The digital result of the analog to digital conversion is thus made available/fed to/acquired by a processing element or calculator 96. The processing element or calculator 96 may be a general purpose or a special purpose processor, and may be for inclusion in a device, e.g. a chip that has other components that perform other functions. The processing element may for example be a microcontroller, a microprocessor or a state machine. In particular it may include a programmable controller, for instance a programmable digital logic device such as a Programmable Array Logic (PAL), a Programmable Logic Array (PLA), a programmable Gate Array, especially a Field Programmable Gate Array (FPGA). The processing element or calculator 96 may be adapted to also generate the signal CLK when that signal is not generated by a distinct signal generator 97. A reference magnetic field generator, e.g. coil 98, generates a reference magnetic field $B_{Cal}$ for example when a reference current $I_{Cal}$ is sent through it. The orientation of the reference magnetic field $B_{Cal}$ generated by the coil 98 is such that it will be sensed by the Hall sensor 91. The amplitude and direction of the reference magnetic field $B_{Cal}$ are determined by a biasing element 99 e.g. an electrical signal source, such as a current source or a voltage source. In particular embodiments, the amplitude of the reference current $I_{Cal}$ may be determined by a DAC i.e. a digital to analog converter. The direction of the reference current $I_{Cal}$ generated by the current source 99 will determine the direction of the reference magnetic field $B_{Cal}$. The amplitude of reference current $I_{Cal}$ generated by the current source 99 will determine the amplitude of the reference magnetic field $B_{Cal}$. While variations of the amplitude of current $I_{Cal}$ with parameters like temperature, aging of components, are the general case, it will be assumed for the sake of clarity that the amplitude of $I_{Cal}$ does not vary in function of those parameters. This may be obtained, for instance, with integrated circuits, which allow manufacturing current sources that generate currents with amplitudes that remain substantially constant over wide temperature intervals.

Figure 11:
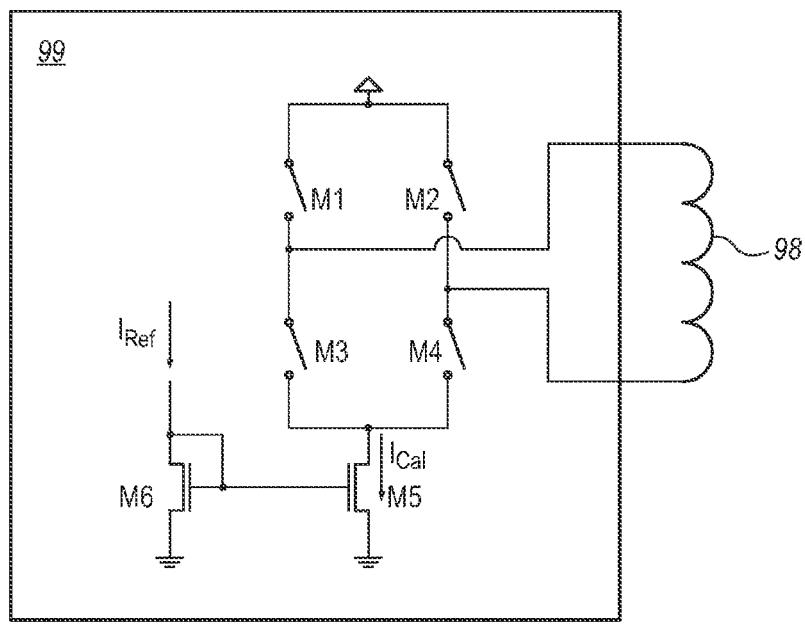
FIG. 11 illustrates an embodiment of a current source for use as a calibration element in a device according to embodiments of the present invention.

FIG. 11 illustrates an example of a current source 99 that can be used to generate a reference magnetic field $B_{Cal}$ considered for example in the first embodiment of methods according to embodiments of the present invention. Four switches e.g. MOSFET transistors M1, M2, M3 and M4 are connected to form a full H-bridge. The coil 98 is connected to the outputs of the full H-bridge. When the switches M1 and M4 are closed (while switches M2 and M3 are open), the current $I_{Cal}$ will flow through the coil 98 in a first direction. When the switches M2 and M3 are closed (while switches M1 and M4 are open), the current $I_{Cal}$ will flow through the coil 98 in a second direction. Changing the direction of the current in the coil 98 results in changing the polarity of the magnetic field $B_{Cal}$ (i.e. the change of sign for $B_{Cal}$ on FIG. 6 and FIG. 8. The amplitude of the calibration current $I_{Cal}$ is determined by (a) a reference current $I_{Ref}$ (generated in any suitable way known to the art) and (b) the ratio of the dimensions of transistors M6 and M5. Opening and closing of transistors M1, M2, M3 and M4 may be controlled by e.g. the processing element or calculator 96.

Figure 12:
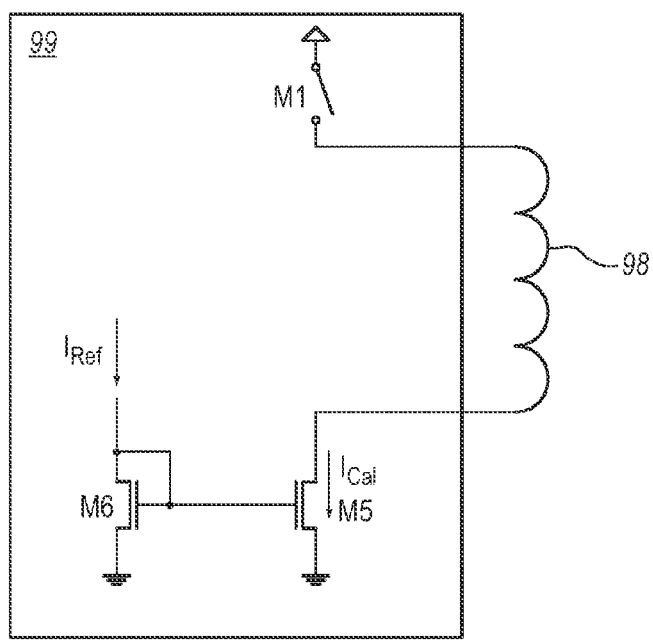
FIG. 12 illustrates another embodiment of a current source for use as a calibration element in a device according to embodiments of the present invention.

FIG. 12 illustrates an example of a current source 99 that can be used to generate a reference magnetic field $B_{Cal}$ considered for example in the second embodiment of methods according to embodiments of the present invention. The amplitude of the calibration current $I_{Cal}$ is determined by (a) a reference current $I_{Ref}$ (generated in any suitable way known to the art) and (b) the ratio of the dimensions of transistors M6 and M5 that forms a current mirror (where M5 mirrors M6). In FIG. 7, the calibration magnetic field keeps the same amplitude and the same polarity throughout the 0 degree phase and the first sub-phase of the 90 degree phase. This may be realized with the circuit of FIG. 12 when the transistor switch M1 is closed and allows the current $I_{Cal}$ to flow from a power supply, through the transistor switch M1, through the coil 98 and through transistor M5. The calibration magnetic field is cancelled during the second sub-phase of the 90 degree phase: this is realized by opening the transistor switch M1. Opening and closing of transistor switch M1 may be controlled by e.g. the processing element or calculator 96.

In a more general case, the current source 99 may be a current digital to analog converter translating a digital code determined by the processing element or calculator 96 into a current $I_{cal}$.

Figure 13A:
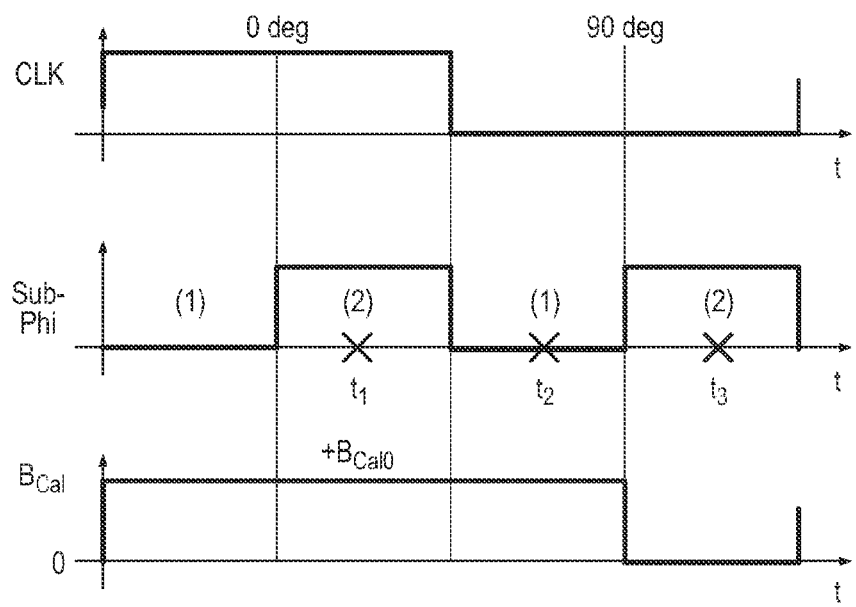
FIG. 13A illustrates a timing chart corresponding to a method according to the second embodiment of the present invention.

The processing element or calculator 96 is a controller adapted for controlling correct functioning of the hardware illustrated in FIG. 10. Besides performing calculations on the output signals of the magnetic sensor device, and determining the parameters of the reference magnetic field $B_{Cal}$ (by e.g. controlling the biasing element 99), the processing element or calculator 96 may also determine the moment in time at which the amplified Hall voltage at the output of amplifier 94 must be sampled, e.g. converted by the ADC 95. FIG. 13A shows for the second embodiment, as also illustrated in FIG. 7, the signal CLK determining whether the system is in a first or in a second phase, e.g. 0 degree or 90 degree phase, a signal SubPhi, which is a signal that divides the first and second phases, e.g. the 0 degree and the 90 degree phases, each into two sub-phases (1) and (2), and the corresponding reference magnetic field $B_{Cal}$. The CLK and the sub-Phi signals can be combined (in a number of ways, known to a person skilled in the art) into signal indicating that the (amplified) Hall voltage must be measured, e.g. converted by the ADC 95 for acquisition by the processing element or calculator 96. For instance, the signals CLK and Sub-Phi as illustrated in FIG. 13A are combined according to the truth table here below to determine when to activate and when to cancel the calibration magnetic field $B_{Cal}$ and the sub-phases within which A to D conversion is required:

TABLE 1

|        | CLK | Sub-Phi | Bcal* | ADC_Req |
|--------|-----|---------|-------|---------|
| 0 deg  | H   | L       | H     | H       |
|        | H   | H       | H     | L       |
| 90 deg | L   | L       | H     | H       |
|        | L   | H       | L     | H       |

When the digital signal Bcal* is high, a calibration magnetic field $B_{Cal}$ is generated by the coil 98. This corresponds on FIG. 13A to the entire 0 degree phase (CLK signal is H) and the first sub-phase of the 90 degree phase (CLK signal is L and Sub-Phi signal is L). When the digital signal Bcal* is low, the calibration magnetic field $B_{Cal}$ is cancelled. This corresponds on FIG. 13A to the second sub-phase of the 90 degree phase (CLK signal is L and Sub-Phi signal is H).

Figure 13B:
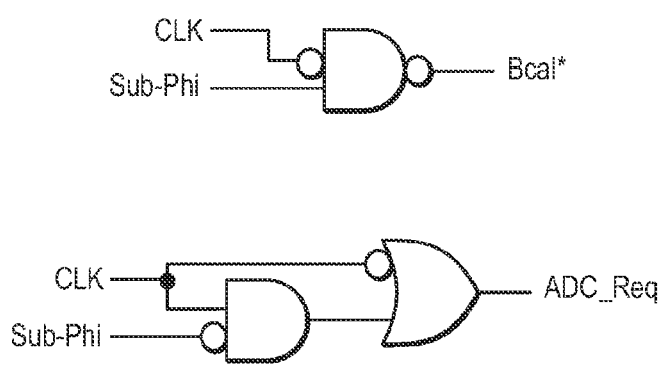
FIG. 13B illustrates a digital circuit that will generate signals for obtaining the timing chart of FIG. 13A.

When the digital signal ADC_Req is high, it indicates that a signal acquisition and Analog to Digital conversion of that signal is required (i.e. around the instants t1, t2 and t3 on FIG. 13A). On FIG. 13A, this happens once during the 0 degree phase (instant $t_1$) when CLK is H and Sub-Phi is low and it happens twice during the 90 deg. An example of digital circuit that will generate signals according to Table 1 is given in FIG. 13B. The processing element or calculator 96 will check the value of both signals Bcal* and ADC_Req within each sub-phase and take action accordingly. Alternatively, the processing element 96 may use table 1 as a look-up table to generate the signals Bcal* and ADC_Req.

For the second embodiment, the amplified Hall voltage $G^*V_H$ is converted by the ADC 95 and acquired by the processing element or calculator 96 once during the first phase, e.g. 0 degree phase, (at e.g. time $t_1$ on FIG. 13A) and twice during the second phase, e.g. 90 degree phase, (once in sub-phase (1) of the 90 degree phase—at e.g. time $t_2$—and once in sub-phase (2) of the 90 degree phase at e.g. time $t_3$). For each measurement, an equation similar to one of the equations Eq. 6, Eq. 7 or Eq. 8 can be written:

$$G^*V_{H1}=G^*(SB_{Ext}+SB_{Cal}+V_{op}) \quad \text{(Eq. 17)}$$

$$G^*V_{H2}=G^*(SB_{Ext}+SB_{Cal}-V_{op}) \quad \text{(Eq. 18)}$$

$$G^*V_{H3}=G^*(SB_{Ext}-V_{op}) \quad \text{(Eq. 19)}$$

Having acquired the measurements $G^*V_{H1}$, $G^*V_{H2}$, $G^*V_{H3}$ the processing element or calculator 96 proceeds and computes $S\,B_{Cal}$ and $S\,B_{Ext}$ as follows:

$$2^*G^*SB_{Ext}=2^*G^*V_{H3}+(G^*V_{H1}-G^*V_{H2}) \quad \text{(Eq. 20)}$$

$$G^*SB_{Cal}=G^*V_{H2}-G^*V_{H3} \quad \text{(Eq. 21)}$$

Be $G^*S\,B_{Cal}|_0$ ($=G^*S_0\,B_{Cal}$) the value of the quantity $G^*S\,B_{Cal}$ evaluated at a given moment in the past (e.g. right after assembly and power-up of the hardware of FIG. 10) and at a temperature $T_0$ ($S_0$ being the sensitivity of the Hall sensor 91 at that moment and at that temperature). If the quantity $G^*S\,B_{Cal}$ varies from one evaluation moment (according to Eq. 21) to another, the amplitude of the reference magnetic field $B_{Cal}$ and the gain G being constant, it means that the sensitivity S of the Hall sensor has varied. Knowledge of the variations of S through knowledge of variations of $G^*S\,B_{Cal}$ as computed by the processing element or calculator 96 according to equation 21 can be used to correct the measurements made for the external magnetic field $B_{Ext}$ through scaling, for instance.

Comparison of the actual value for the quantity $G^*S\,B_{Cal}$ with $G^*S\,B_{Cal}|_0$ makes the determination of a correction factor $\alpha=G^*S\,B_{Cal}|_0/G^*S\,B_{Cal}$ possible. The correction factor is computed by the processing element or calculator 96. The processing element or calculator 96 corrects the variation of the sensitivity S affecting the product $2^*G^*S\,B_{Ext}$ by multiplying it by $\alpha$. This correction ensures that the measurements made for the external magnetic field will not be affected by sensitivity drift and this without a priori knowledge of the dependency of the sensitivity S on external factors such as temperature, stress, and without actual measurement of these external factors such as e.g. the temperature, the stress, the operation of addition, subtraction, division, may be carried out by processing element or calculator 96 in any convenient way known to the art. The storage of the measurement results $G^*V_{H1}$, $G^*V_{H2}$, $G^*V_{H3}$ in a format usable by the processing element or calculator 96 may be done with the help of registers, memory elements, available for that purpose in any suitable way known to the art. In a general case, one has not to assume that the gain G of amplifier 94 has remained constant. The compensation for drift of the gain G will be compensated together with the variation of sensitivity, the correction factor alpha now including the gain G. In this embodiment a calibration phase comprises the generation of a reference magnetic field that varies as illustrated e.g. on FIG. 13A, taking three measurements of the Hall voltage at three time instants $t_1$, $t_2$, $t_3$ spread over one cycle (first and second phase) of the CLK signal generated for the purpose of isolating the contribution of an external magnetic field $B_{Ext}$ to the Hall voltage $V_H$ from an offset Vop affecting that Hall voltage $V_H$, evaluating the quantity $G^*S\,B_{Cal}$, and determining a correction factor $\alpha=G^*S\,B_{Cal}|_0/G^*S\,B_{Cal}$. The correction factor at is then used to correct the measurement of the external magnetic field $B_{Ext}$ until the next calibration phase where an updated correction factor $\alpha$ will be computed. The processing element or calculator 96 may be programmed to perform the calibration phase continuously (i.e. every CLK cycle), on a regular basis but at a slower rate than the CLK signal (e.g. once every plurality of CLK cycles, e.g. once every 10 CLK cycles) or on a need-to basis, in which case the processing element or calculator 96 may receive an input signal, e.g. a user supplied or other externally supplied signal, indicating that a calibration process needs to be performed. The processing element or calculator 96 may operate on a need-to basis when it has e.g. access to the readings of a temperature sensor (not shown) sensing the temperature of the Hall sensor or the surrounding of the Hall sensor (assuming then that the temperature of the Hall sensor follows the temperature measured by the temperature sensor). A variation of the temperature as indicated by the temperature sensor will be accompanied by variation of the sensitivity S and will indicate that a calibration of the sensor is required. Outside of the calibration phases, the same hardware is used and the signal $S\,B_{Ext}$ is isolated from an offset Vop contributing to the total Hall voltage $V_H$ at the output of the Hall sensor 91 with a dynamic offset compensation technique known from the art.

In some cases, e.g. when the processing element or calculator 96 is a state machine of limited size and complexity, it may be advantageous to limit the role of the processing element or calculator 96 to the determination of $G*S\ B_{Cal}$ (not $2*G*S\ B_{Ext}$) and its comparison with $G*S\ B_{Cal}|_0$. In that case, the result of the comparison may be used to vary a parameter of the biasing element 93 e.g. the amplitude of the bias current $I_{Bias}$. For instance, if the processing element or calculator 96 computes the ratio $\alpha = G*S\ B_{Cal}|_0/G*S\ B_{Cal}$, the bias current with amplitude $I_{Bias}$ is modified according to the ratio $\alpha$: $I_{Bias} = I_{Bias0}/\alpha$ (where $I_{Bias0}$ is the amplitude of the bias current in the reference conditions where $G*S\ B_{Cal}|_0$ was determined). When the biasing element 93 is a DAC current source, the modification of bias current merely requires the processing element or calculator 96 to issue a digital code updated according to $I_{Bias} = I_{Bias0}/\alpha$ and program the DAC accordingly.

As said earlier, there is one notable instance in which the temperature might vary within the time interval necessary to take the measurements $V_{H1}$, $V_{H2}$, $V_{H3}$ (and optionally $V_{H4}$). The magnetic field generator, e.g. the coil 98, used to generate the reference magnetic field $B_{Cal}$ and the Hall sensor 91 may be integrated together in the same semiconductor substrate. The magnetic field generator, e.g. coil 98, may be realized using one or more metallic layers available for connecting different devices integrated in the semiconductor substrate. Those metallic layers having a non-zero resistivity, the coil 98 presents a parasitic resistance $R_{Coil}$ and hence it dissipates heat (Joule heating) when the reference current $I_{Cal}$ circulates through it. The higher the parasitic resistance and/or the higher the amplitude of the reference current $I_{Cal}$ (and hence the amplitude of the reference magnetic field $B_{Cal}$), the higher the Joule heating. At the scale of the integrated Hall sensor 91 and the integrated coil 98, the time constants may be as low as fraction of ms which is of the same order of magnitude as the typical frequency of the signal CLK that determines in which phase (0 degree or 90 deg) the Hall sensor 91 is.

Reducing the resistance of the coil 98 is not always possible and therefore, there are cases where one needs to reduce the amplitude of the reference current $I_{Cal}$ and hence the amplitude of the reference magnetic field $B_{Cal}$. In those cases, the effect of noise (1/f noise, transients introduced by the switches) may render the evaluation of $S\ B_{Cal}$ difficult even after amplification. To palliate to that inconvenient, the proposed invention may be adapted/improved with minor modifications as described here below.

Figure 14:
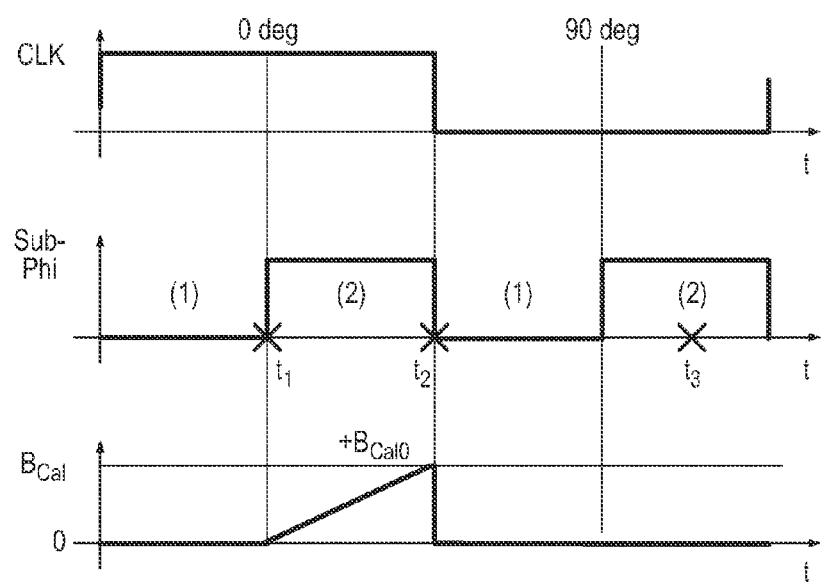
FIG. 14 illustrates a timing chart for a method according to a further embodiment of the present invention.

Instead of generating the calibration magnetic field that varies in a stepwise manner as e.g. on FIG. 13A, the reference magnetic field $B_{Cal}$ may vary as seen on FIG. 14. The fundamental frequency of the reference magnetic field $B_{Cal}$ is the same as that of the CLK signal, the amplitude of the reference magnetic field $B_{Cal}$ is zero during sub-phase (1) of the first phase, e.g. 0 degree phase, and during the entire second phase, e.g. 90 degree phase, while it varies linearly from 0 to a pre-determined value $Bcal0 \neq 0$ during sub-phase (2) of the first phase, e.g. 0 degree phase. Such a variation of the amplitude of the reference magnetic field $B_{Cal}$ prior to measurement at time $t_2$ is less abrupt than the stepwise variation considered earlier and will introduce less noise (e.g. by capacitive coupling between the magnetic field generator, e.g. the coil 98, and the Hall sensor 91).

Figure 15A:
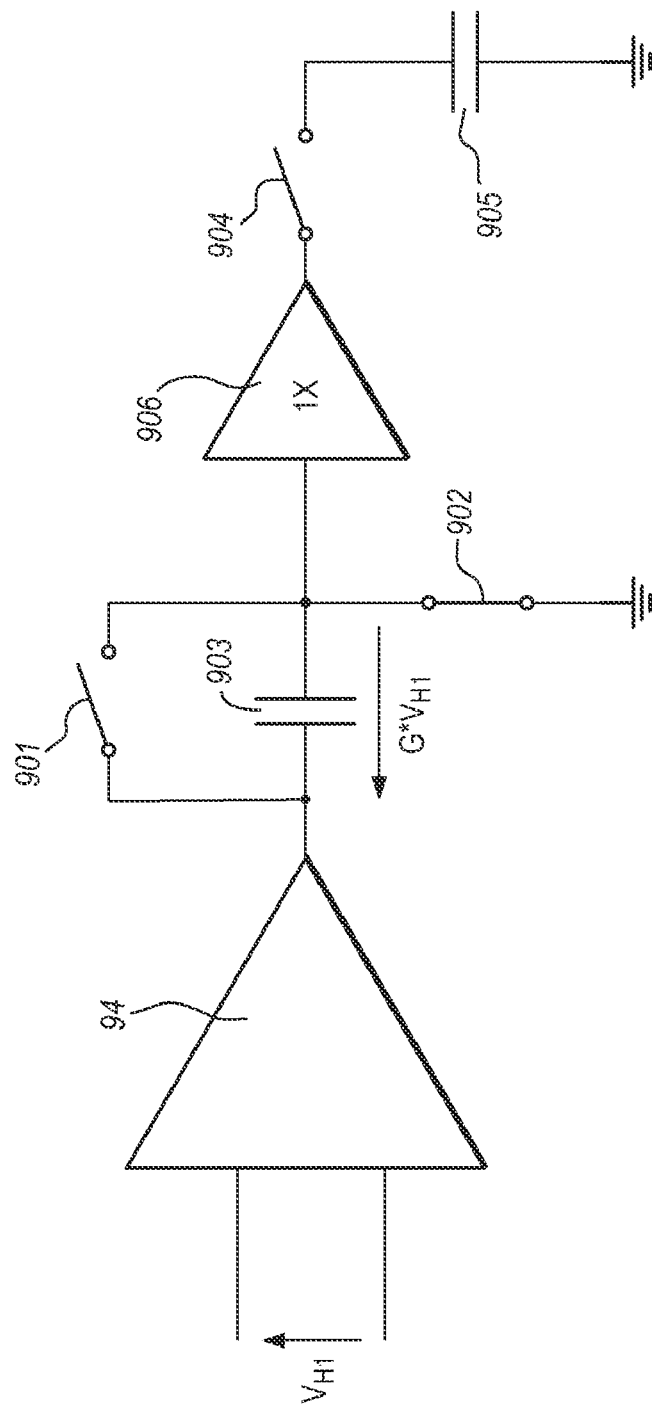
FIG. 15A and FIG. 15B illustrate a correlated double sampling (CDS) stage for use with a device according to embodiments of the present invention, and the operation thereof.
Figure 15B:
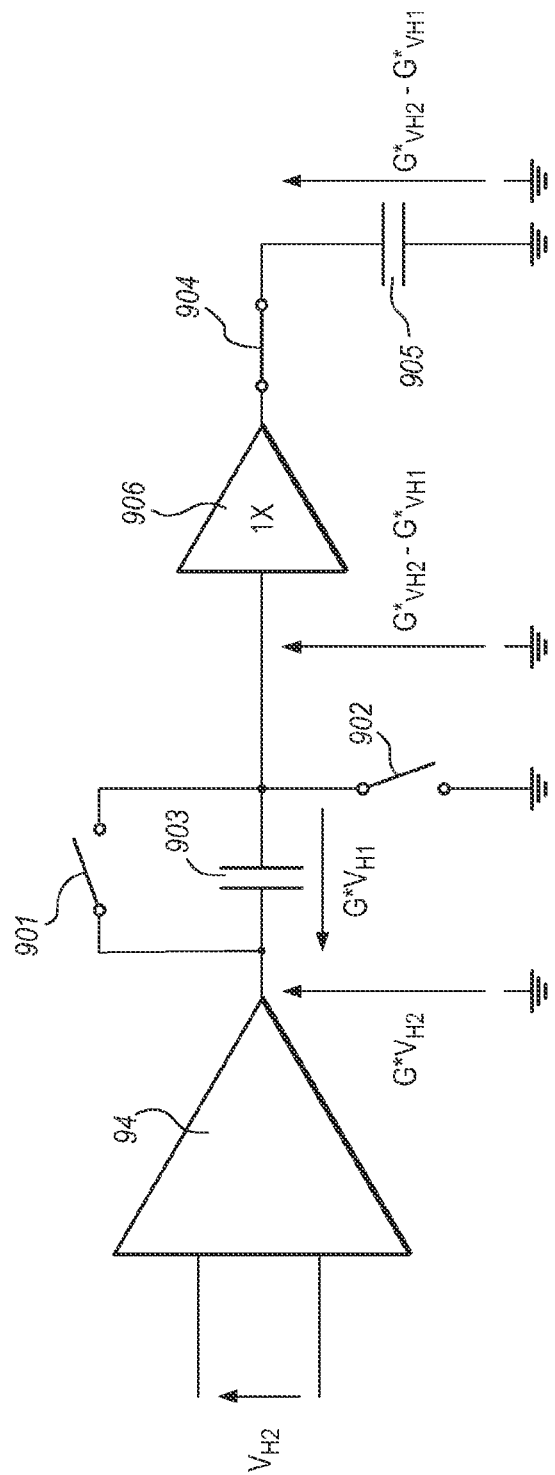

A further improvement, of application with a step-like or slope-like variation for the reference magnetic field $B_{Cal}$, is achieved by adding a correlated double sampling (CDS) stage 900 between the amplifier 94 and the ADC 95. FIG. 15A and FIG. 15B give an example of such a CDS stage and illustrates the operation thereof. The CDS stage 900 comprises a first memory element, e.g. capacitor 903, coupled between the output of the amplification stage 94 and a buffer 906. The capacitor 903 is provided with a first and a second resetting element, e.g. a first switch 901 and a clamp switch 902. The output of the buffer 906 is coupled to a sample and hold circuit comprising a sampling element, e.g. sample switch 904, and a memory element, e.g. capacitor 905.

As illustrated in FIG. 15A, for a brief instant after the reference time instant $t_0$ and before a first measurement time instant $t_1$, the clamp switch 902 is briefly closed so that the capacitor 903 is coupled to ground and the amplified Hall voltage $G*V_H$ is stored across the capacitor 903:

$$G*V_H(t_1) = G*(SB_{Ext} + V_{op}).$$

Thereafter, the clamp switch 902 is opened again, the amplified Hall voltage $G*V_H$ remaining stored across the capacitor 903.

After the first measurement time instant $t_1$ and before a second time instant $t_2$ (or on the second measurement time instant $t_2$ when reference magnetic field $B_{Cal}$ increases linearly between time instants $t_1$ and $t_2$, as illustrated in FIG. 14) that signals the end of the 0 degree phase (i.e. right before the beginning of the second phase, e.g. 90 degree phase), while the amplified Hall voltage is equal to $G*V_{H2} = G*(S\ B_{Ext} + S\ B_{Cal} + V_{op})$, the sample switch 904 is closed, resulting in an output voltage VCDS proportional to the difference between $G*V_{H2}$ and $G*V_{H1}$ being stored on the memory element such as e.g. capacitor 905, as illustrated in FIG. 15B.

It has been assumed that all time constant associated with the switches are negligible when compared to the sampling interval and the clamping interval. The clamp and sample capacitors being subject to reset noise (also known as "kTC" noise), it has been assumed that they have sufficiently large capacitances to avoid introducing substantial additional noise contributions. After conversion by the ADC 95, the quantity $V_{CDS} = G*S\ B_{Cal}$ is available to the calculator 96 to evaluate the ratio $\alpha = G*S\ B_{Cal}|_0/G*S\ B_{Cal}$. The ratio cc can be used as discussed above to compensate for variations of the sensitivity S. In order not to lose one clock cycle for the measurement of the external magnetic field, the (amplified) Hall voltage may be measured at time t1 and t3:

$$G*V_H(t_1) = G*(SB_{Ext} + V_{op})$$

$$G*V_H(t_3) = G*(SB_{Ext} - V_{op})$$

Based on those two measurements, the calculator 96 may calculate $G*S\ B_{Ext}$:

$$G*SB_{Ext} = \tfrac{1}{2}(G*V_H(t_1) + G*V_H(t_3))$$

Figure 16:
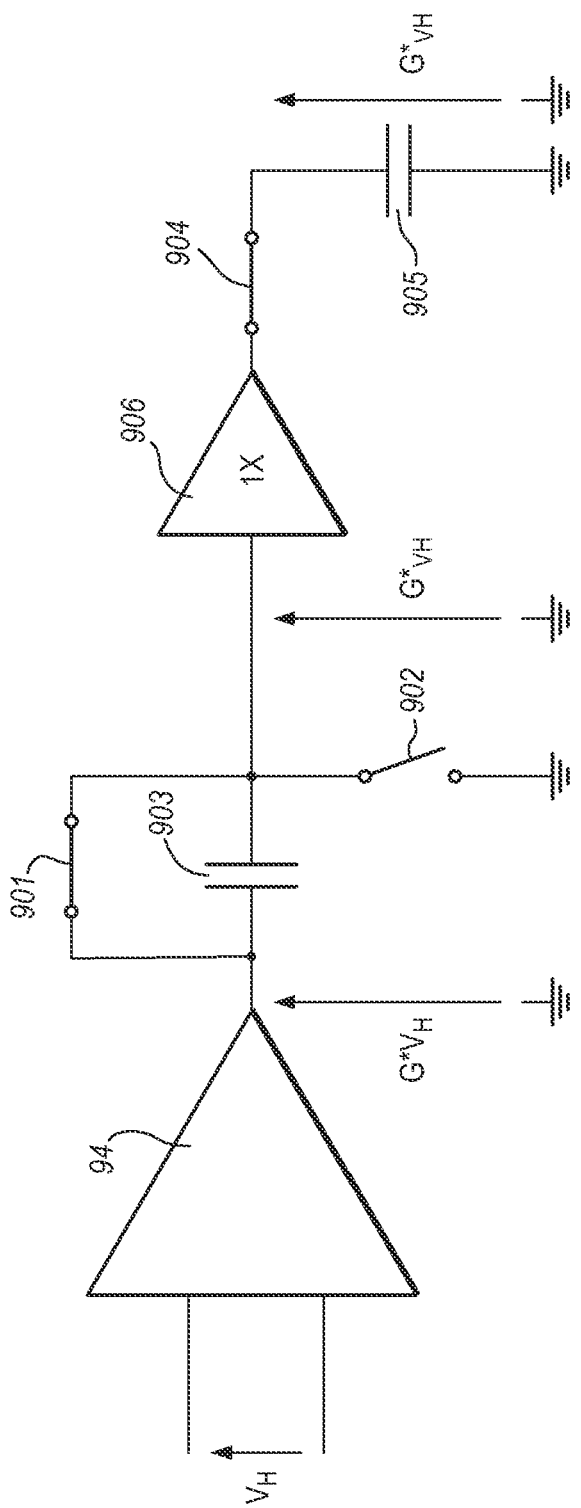
FIG. 16 illustrates use of the circuit of FIG. 15A and FIG. 15B in case CDS is not required.

When the CDS stage is not required the switch 901 is closed together with the sample switch 904 to e.g. guarantee the availability of the signals $G*V_H(t_1)$ and $G*V_H(t_3)$ that allows dynamic offset compensation. The CDS is then configured as seen on FIG. 16.

It is to be understood that although preferred embodiments, specific constructions and configurations, as well as materials, have been discussed herein for devices according to the present invention, various changes or modifications in form and detail may be made without departing from the scope of this invention as defined by the appended claims. For example, any formulas given above are merely representative of procedures that may be used. Functionality may be added or deleted from the block diagrams and operations may be interchanged among functional blocks. Steps may be added or deleted to methods described within the scope of the present invention.

The invention claimed is:

1. A method to compensate a sensitivity drift of a magnetic field sensor for sensing a magnetic field $B_{Ext}$, the sensor comprising at least four electrodes, the method comprising:
- a first step where a first set of two electrodes of the at least our electrodes is used to bias the sensor and a second set of two electrodes of the at least four electrodes is used to sense an output signal of the magnetic field sensor; and
- a second step where the second set of two electrodes is used to bias the sensor and the first set of two electrodes is used to sense another output signal of the magnetic field sensor;
- the method being characterized in that:
- the second step is subdivided in at least a first sub-step and a second sub-step, a reference magnetic field having first magnetic field parameters in the first sub-step and second magnetic field parameters in the second sub-step wherein during both the first step and one of the first and second sub-steps of the second step the reference magnetic field has a first amplitude and a first phase for both the first step and the one of the first and second sub-steps and during only one of the first or second sub-steps the reference magnetic field has one of a) a greater amplitude than the first amplitude and has the first phase, or b) a zero amplitude;
- the output signal is sensed in the first step and the another output signal is sensed in the second step; and
- the another output signal is sensed within the first and second sub-step.

2. A method according to claim 1, characterized in that the only one of the first and second sub-steps is the second sub-step.

3. A method according to claim 1, wherein the only one of the first and second sub-steps is the first sub-step.

4. A method according to claim 1, wherein the reference magnetic field has a linearly increasing amplitude during the first or the second sub-step.

5. A method according to claim 1, furthermore comprising performing a correlated double sampling on the output signal of the magnetic field sensor.

6. The method of claim 1 further including performing, within a processing system coupled to the magnetic field sensor, at least a portion of the steps of claim 1.

7. The method of claim 6 further including providing for the processing system, a machine readable data storage device for storing information related to the steps of claim 1.

8. The method of claim 7 further including transmitting any of the information over a local or wide area telecommunications network.

9. A control unit for a magnetic sensor device comprising at least four electrodes, the control unit comprising:
- timing means providing a timing signal for controlling timing of biasing and sensing of the magnetic sensor device, a bias signal being applied to a first set of two electrodes of the at least four electrodes of the magnetic sensor device and an output signal being measured between a second set of two electrodes of the at least four electrodes during a first step, and a bias signal being applied to the second set of two electrodes and an output signal being measured between the first set of two electrodes during a second step;
- means for switching the biasing and the sensing between the first and the second set of two electrodes, dependent on the provided timing signal; and
- means for controlling changing of magnetic field parameters of a reference magnetic field so that the reference magnetic field has first magnetic field parameters having a first amplitude and a first phase in a first sub-step of the first step and having the first amplitude and the first phase in a second sub-step of the first step, the reference magnetic field has the first amplitude and the first phase in a first sub-step of the second step, and the reference magnetic field has second magnetic field parameters having a second amplitude and a second phase during a second sub-step of the second step, wherein the second magnetic field parameters include one of a) an amplitude that is different than an amplitude of the first magnetic field parameters, or b) a zero amplitude.

* * * * *